(12) United States Patent
Gupta

(10) Patent No.: US 6,529,058 B2
(45) Date of Patent: Mar. 4, 2003

(54) APPARATUS AND METHOD FOR OBTAINING STABLE DELAYS FOR CLOCK SIGNALS

(75) Inventor: Sandeep Kumar Gupta, Mountain View, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/956,978

(22) Filed: Sep. 21, 2001

(65) Prior Publication Data

US 2002/0089365 A1 Jul. 11, 2002

Related U.S. Application Data

(60) Provisional application No. 60/260,926, filed on Jan. 11, 2001.

(51) Int. Cl.[7] .............................................. H03H 11/26
(52) U.S. Cl. ..................................................... 327/276
(58) Field of Search ......................... 327/132, 261–264, 327/276–278, 281, 284–285, 288, 299

(56) References Cited

U.S. PATENT DOCUMENTS

| 4,375,595 | A |   | 3/1983  | Ulmer et al. ............... 307/297 |
|-----------|---|---|---------|------------------------------------|
| 4,806,804 | A |   | 2/1989  | O'Leary ..................... 307/605 |
| 4,853,654 | A |   | 8/1989  | Sakurai ....................... 331/57 |
| 5,175,452 | A |   | 12/1992 | Lupi et al. .................. 307/591 |
| 5,250,914 | A | * | 10/1993 | Kondo ........................ 331/111 |
| 5,731,727 | A | * | 3/1998  | Iwamoto et al. ............ 327/281 |
| 6,014,042 | A |   | 1/2000  | Nguyen ......................... 327/3 |
| 6,034,557 | A |   | 3/2000  | Schultz et al. ............. 327/276 |
| 6,097,231 | A | * | 8/2000  | Moscaluk ................... 327/264 |
| 6,133,751 | A |   | 10/2000 | Churcher et al. ............. 326/49 |
| 6,163,195 | A | * | 12/2000 | Jefferson ................... 327/261 |
| 6,262,616 | B1| * | 7/2001  | Srinivasan et al. ......... 327/264 |
| 6,304,148 | B1| * | 10/2001 | Nomura et al. ............... 326/95 |

OTHER PUBLICATIONS

Copy of European Search Report for Application No. 02250203.3–1233, dated Apr. 2, 2002, 3 pages.

* cited by examiner

*Primary Examiner*—My-Trang Nu Ton
(74) *Attorney, Agent, or Firm*—Sterne, Kessler, Goldstein & Fox PLLC

(57) ABSTRACT

A circuit and method for obtaining a stable delay for a clock signal comprises a current source to generate a constant current having a first value; first and second current over capacitance (I/C) stages coupled to the current source and between a supply voltage and ground; and a capacitor, having a second value and coupled to a node formed by an output of the first I/C stage and an input of the second I/C stage. Application of a clock signal to an input of the first I/C stage produces an output at a logic gate coupled to an output of the second I/C stage. The output has a stable delay based on the first and second values. Additionally, the first and second values (i.e., the value of the current or capacitance) can be changed to achieve a desired amount of the delay applied to the input clock signal.

15 Claims, 6 Drawing Sheets

A: (23.6496n 1.79458)  DELTA: (630.787p−115.68u)
B: (24.2803n 1.79446)  SLOPE: −183.391K

APPARATUS AND METHOD FOR OBTAINING STABLE DELAYS FOR CLOCK SIGNALS

CROSS-REFERENCE TO RELATED APPLICATION

This application claims priority to Provisional U.S. Patent Application No. 60/260,926, filed Jan. 11, 2001.

BACKGROUND OF THE INVENTION

1. Field of the Invention

The present invention relates to clock circuits and, in particular, to an apparatus and method for obtaining stable delays for clock signals.

2. Background Art

Today's highly integrated digital and mixed signal circuits require stable clock signals over various delay amounts. A conventional technique for delaying a clock signal is to stack invertors, i.e., coupling the output of each preceding invertor to the input of the subsequent invertor. The total clock delay is simply the sum of the nominal delay of each invertor. However, manufacturing process variations can cause the nominal delay of each inventor to be a different value. Moreover, voltage and temperature variations can also cause the amount of delay contributed by each invertor to vary. The cumulative error of these process, voltage and temperature ("PVT") variations can cause hundreds of percent variations in the desired total delay achieved by stacking inventors.

High accuracy clock delay circuits typically comprise phase-locked loops (PLL), which consist of a phase detector, low pass filter and voltage-controlled oscillator, delay-locked loops (DLL), which consist of charge pumps and phase detectors, or the like. Voltage controlled delay lines utilize feedback circuits to track and adjust phase of the clock to achieve high delay accuracy as well. The drawbacks of such high accuracy circuits are the chip real estate, power and design resources needed for implementation. Months of circuit redesign are typically required when new, smaller line width manufacturing processes are developed.

What is needed is a circuit to obtain stable delays for clock signals without the complexity and cost of conventional high accuracy clock delay circuits.

BRIEF SUMMARY OF THE INVENTION

The present invention is directed to an apparatus and method for generating a stable delay for a clock signal with respect to at least one of process, temperature and voltage variations.

In one embodiment of the present invention, a circuit comprises a current source to generate a constant current having a first value; first and second current over capacitance (I/C) stages coupled to the current source and between a supply voltage and ground; and a capacitor, having a second value and coupled to a node formed by an output of the first I/C stage and an input of the second I/C stage. Application of a clock signal to an input of the first I/C stage produces an output at a logic gate coupled to an output of the second I/C stage. The output has a stable delay based on the first and second values. Additionally, the first and second values (i.e., the value of the current or capacitance) can be changed to achieve a desired amount of the delay of the input clock signal.

The first and second I/C stages can each comprise a pair of complementary field effect transistors (FETs). The gates of the FETs of each respective I/C stage are coupled together to form the input of that stage, and drains of the FETs of each respective I/C stage are coupled together to form the output of that stage.

The current source can comprise a bandgap circuit. In one embodiment, an on-chip, switched capacitor is used to provide a constant resistance. The constant resistance, and a constant voltage provided by the bandgap circuit, produce the constant current.

In another embodiment, an off-chip, discrete resistor coupled to a constant voltage provided by the bandgap circuit are used to produce the constant current.

In yet another embodiment, the current source comprises cascoded current mirrors coupled between the supply voltage and the first and second I/C stages, and between the first and second I/C stages and ground.

These and other objects, advantages and features will become readily apparent in view of the following detailed description of the invention.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

DETAILED DESCRIPTION OF THE INVENTION

The preferred embodiment of the present invention will now be discussed in detail. While specific features, configurations and arrangements are discussed, it should be understood that this is done for illustration purposes only. A person skilled in the relevant art will recognize that other steps, configurations and arrangements or devices may be used to achieve the features of the invention without departing from the spirit and scope thereof. Indeed, for the sake of brevity, conventional electronics, manufacturing of semiconductor devices, and other functional aspects of the method/apparatus (and components of the individual operating components of the apparatus) may not be described in detail herein.

Moreover, the terms chip, integrated circuit, monolithic device, semiconductor device and microelectronic device are often used interchangeably in this field. The present invention is applicable to all of the above as they are generally understood in the field.

The terms pins, pads and leads refer to input and/or output terminals of a connector, device, chip, printed circuit, or the like, which are used to provide electrical connection to one or more connectors, devices, chips, printed circuits, or the like.

The terms metal line, trace, wire, conductor, signal path and signaling medium are all related. These related terms are generally interchangeable and appear in order from most specific to most general. In this field, metal lines are sometimes referred to as traces, wires, lines, interconnect or simply metal. Metal lines, generally aluminum (Al) or an alloy of Al and copper (Cu), are conductors which provide signal paths for coupling, or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), or refractory metal silicides are examples of other conductors. Signaling medium is the most general term and encompasses the others.

As discussed below, the following sections more fully describe the present invention.

Figure 1:
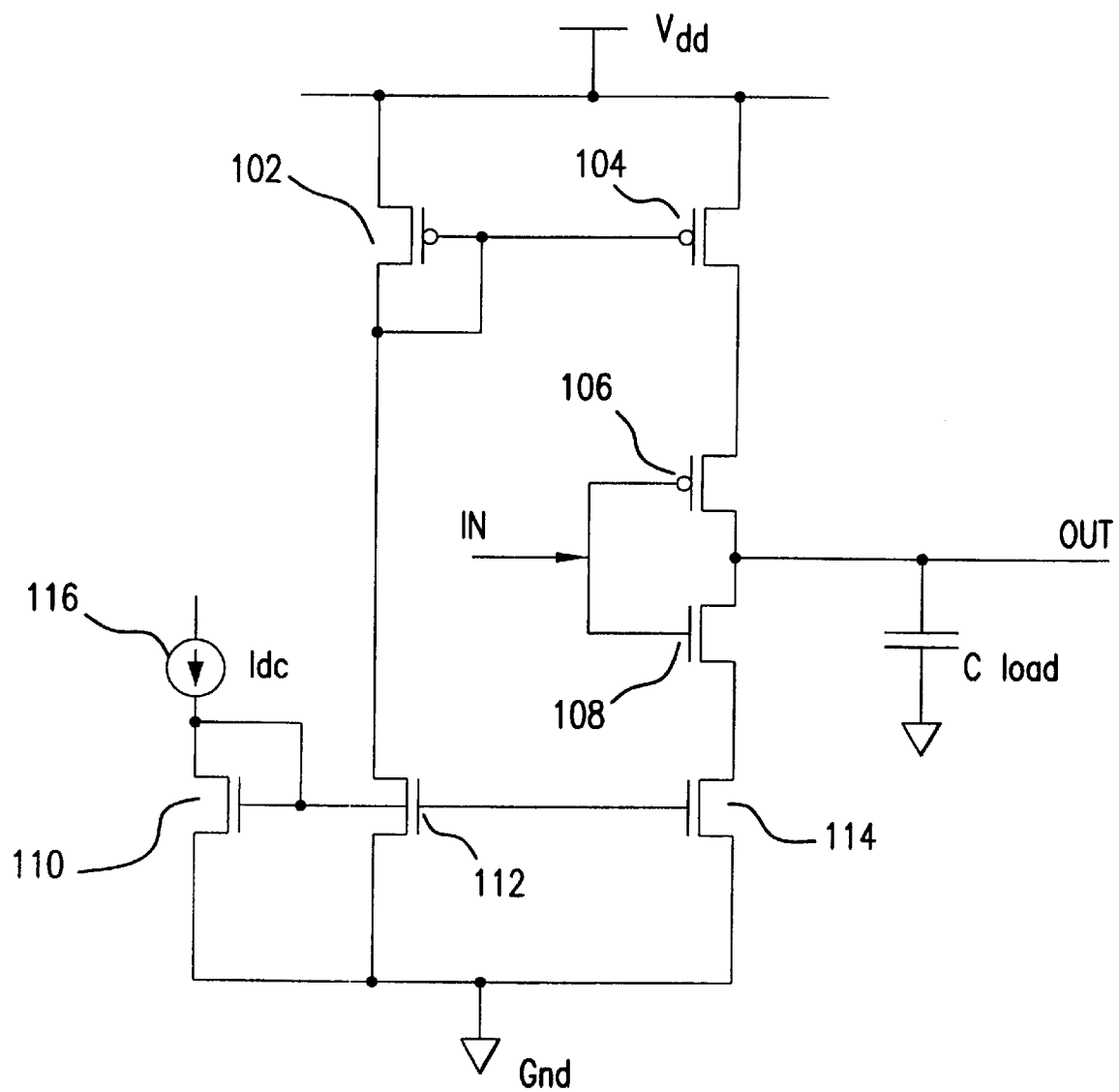
FIG. 1 illustrates a circuit that can be used for delaying a clock signal.
Figure 2:
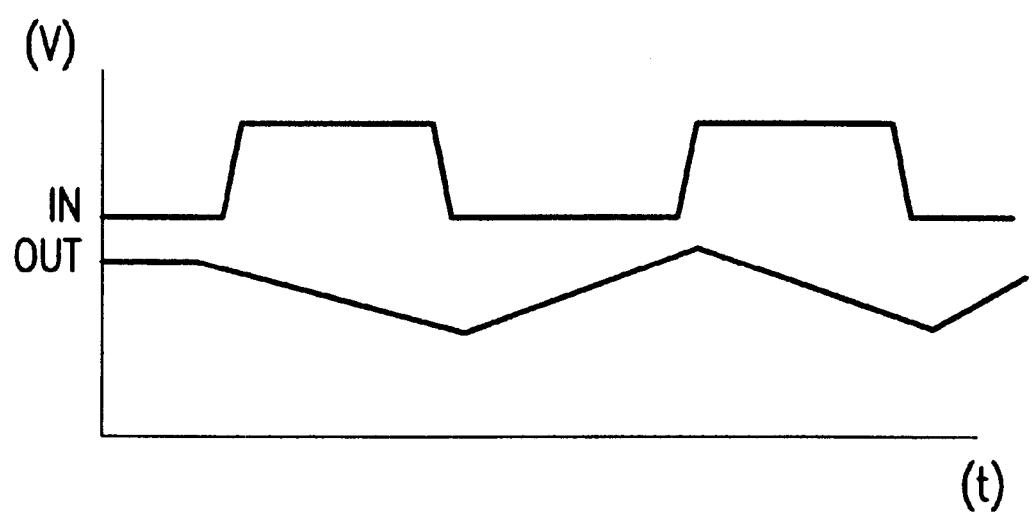
FIG. 2 shows the input and output waveforms corresponding to the circuit of FIG. 1.

FIG. 1 illustrates a circuit that can be used for delaying a clock signal. The circuit of FIG. 1 depicts a constant current approach to delaying a clock signal applied to an input node (labeled "IN"). The output (labeled "OUT") is produced across a capacitor $C_{load}$. If IN is a clock signal having edges as shown at 202 of FIG. 2, the OUT signal behaves as a sawtooth, triangular waveform as shown at 204 of FIG. 2.

The circuit of FIG. 1 is integrated rather than discrete, and comprises transistors 102 through 114. Transistors 102 through 114 comprises field effect transistors (FET) in the preferred embodiment of the present invention. Transistors 102, 104 and 106 are P-type FETs, and transistors 108 through 114 are N-type FETs.

A constant current source $I_{DC}$ 116 is used to provide a constant current based on, for example, a bandgap voltage and an external resistor. Such constant current sources are conventional, and can be implemented readily in many ways, as would be apparent to any person skilled in the art. Other know, functionally equivalent constant current sources could be used instead.

A discrete or "off-chip" resistor is chosen so that a resistance having very low variation with respect to process, voltage and temperature can be achieve. Alternatively, an "on-chip" switch capacitor circuit could be used to implement a stable resistance.

Capacitor $C_{load}$ is preferably implemented as a metal oxide silicon (MOS) capacitor, which has a nominal capacitance value with relatively low variation with respect to process, voltage and temperature. This capacitance value can easily be controlled within approximately 10 to 15 percent tolerance.

Transistors 102, 104, 112 and 114 comprise PMOS and NMOS current mirrors. In an alternative embodiment, there transistors can be replaced by cascode current mirrors or other know, functionally equivalent current mirror configurations, as would become apparent to any person skilled in the art.

Transistors 106 and 108 comprise a "current over capacitance" (hereafter an "I/C" ) stage. Providing the constant current and the constant capacitance (by the current source $I_{DC}$ and $C_{load}$, respectively) to the I/C stage produces a stable delay of the input clock signal. But the triangular waveform produced by the circuit of FIG. 1 requires conditioning.

The OUT node must be followed by a buffer stage to better define the edges of the triangular waveform, so as to be useful as a delayed clock signal. However, a buffer stage implemented with invertors would lead to unwanted PCT variations, as the threshold voltage of the invertors would vary over process, voltage and temperature as described above. Also, process skew corners, such as slow NMOS devices and fast PMOS devices, would cause the duty cycle of the output signal of the conditioning invertors to vary substantially with respect to the input signal. To avoid such problems, a "true" comparator would be required to correct the triangular waveform and make the output PVT insensitive. The drawback of this approach is that a "true" comparator is highly complex with respect to the delay circuit of FIG. 1, and thus, renders the overall design impractical.

Figure 3:
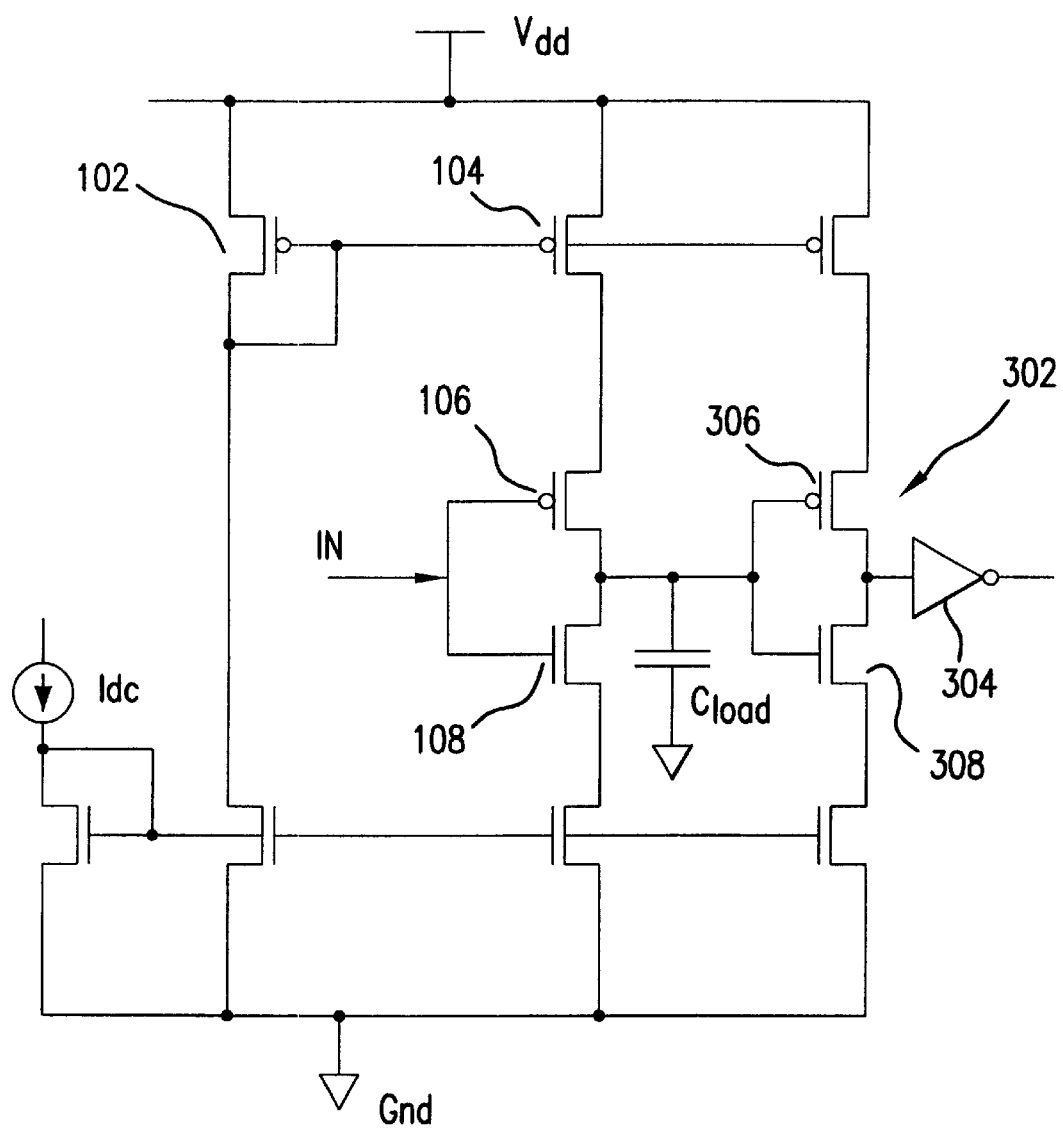
FIGS. 3 and 4 illustrate circuits for obtaining a stable delay for clock signal, according to embodiments of the present invention.

Based on his understanding of the above problems, the inventor has discovered an elegant solution to the problem. According to the present invention, the first I/C stage is followed by a second I/C stage 302, as illustrated in FIG. 3. The second I/C stage 302, in contrast to the first I/C stage, needs a large skew to produce crisp edges. This is obtained by loading the second I/C stage 302 with a minimum amount of gate capacitance. Such a minimum amount of gate capacitance, as viewed by the output of the second I/C 302, would be the equivalent to the input capacitance of a logic gate, such as the inverter 304. Any type of logic gate having a small input capacitance, say on the order of 15–20 fF (fF stands for fempto farads; 1 fF=1e-15farads), can be coupled to the output of the second I/C stage.

In the preferred embodiment of the preferred invention transistors 306 and 308 are designed to have to have the same current density characteristics as transistors 106 and 108 of the first I/C stage. Thus, independent of the strength of transistors 306 and 308, the delay of the circuit is determined by the value (i.e., amount) of the constant current and the capacitance selected for $C_{load}$.

Figure 4:
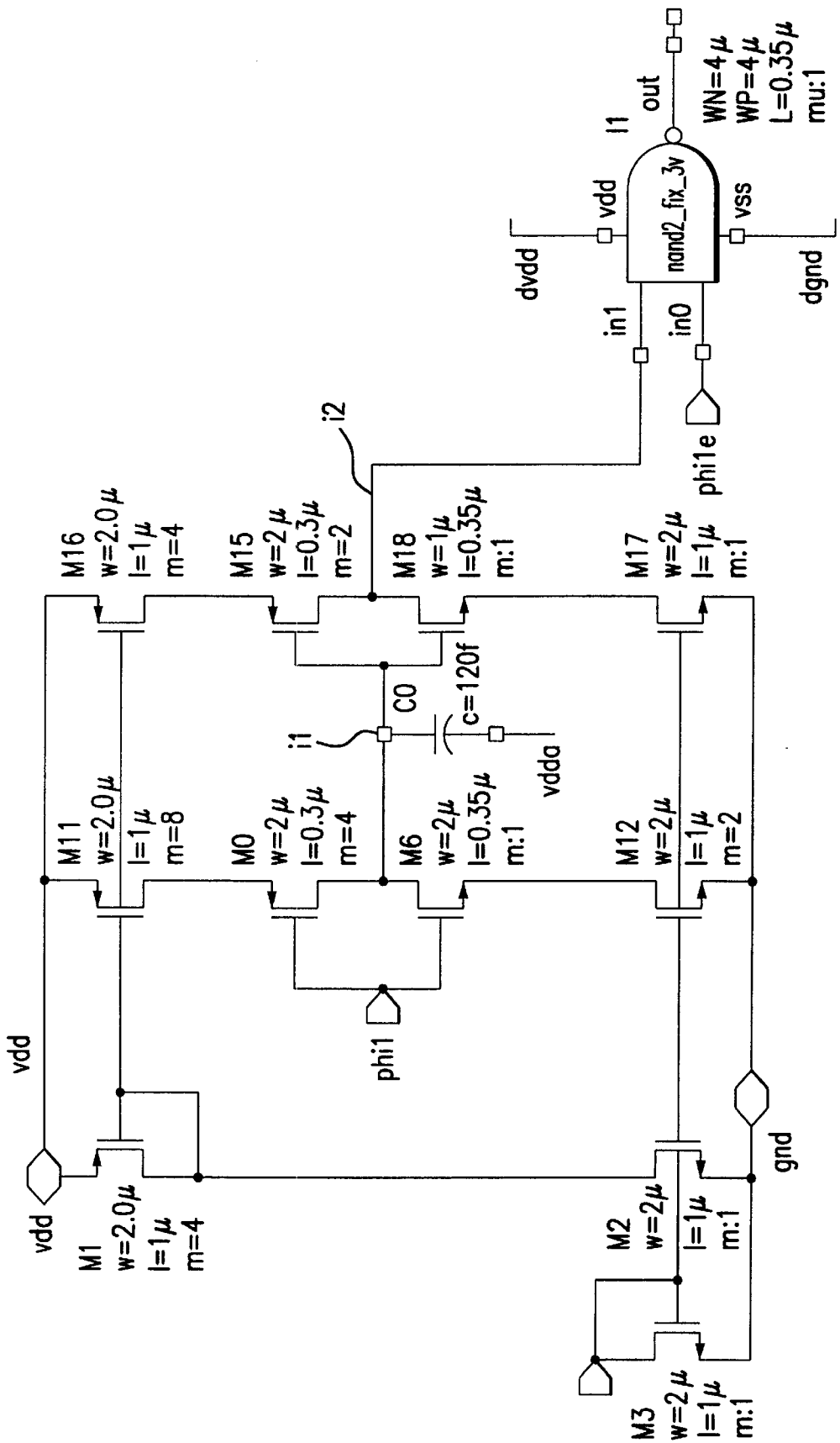

FIG. 4 is a circuit having the same configuration of FIG. 3, but illustrates exemplary values for the various circuit components. In this example implementation, a power supply voltage $V_{dd}$ equals 3.3 V (volts), a constant current source $I_{dc}$ equals 100 μA (micro amps), and $C_{load}$ equals 125 fF. These values are provided by way of example and not limitation.

Figure 5A:
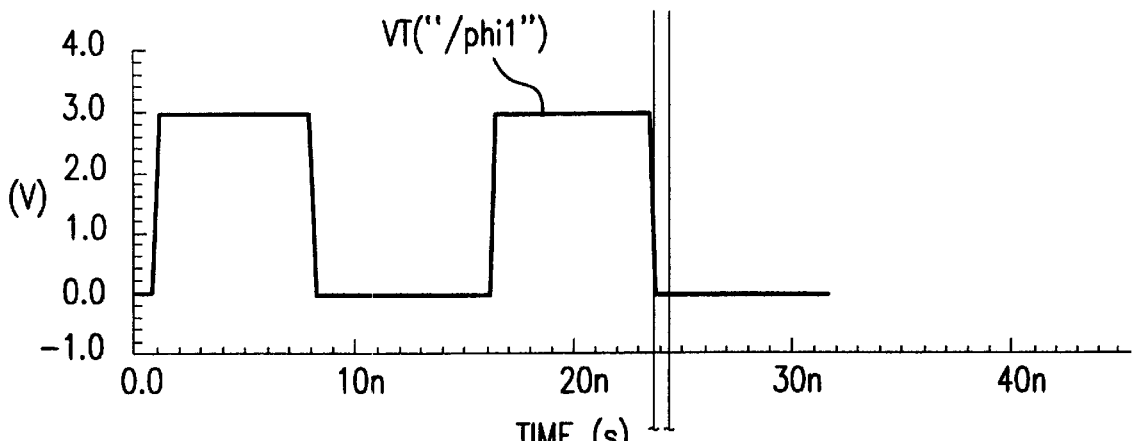
FIGS. 5A, 5B, 5C and 6 show waveforms of the circuit depicted in FIG. 4.
Figure 5B:
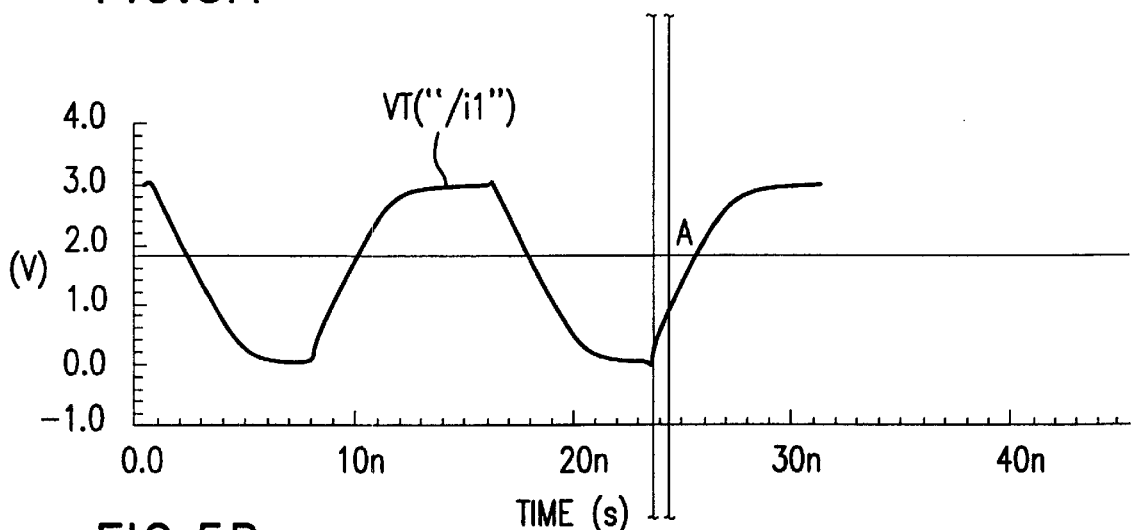
Figure 5C:
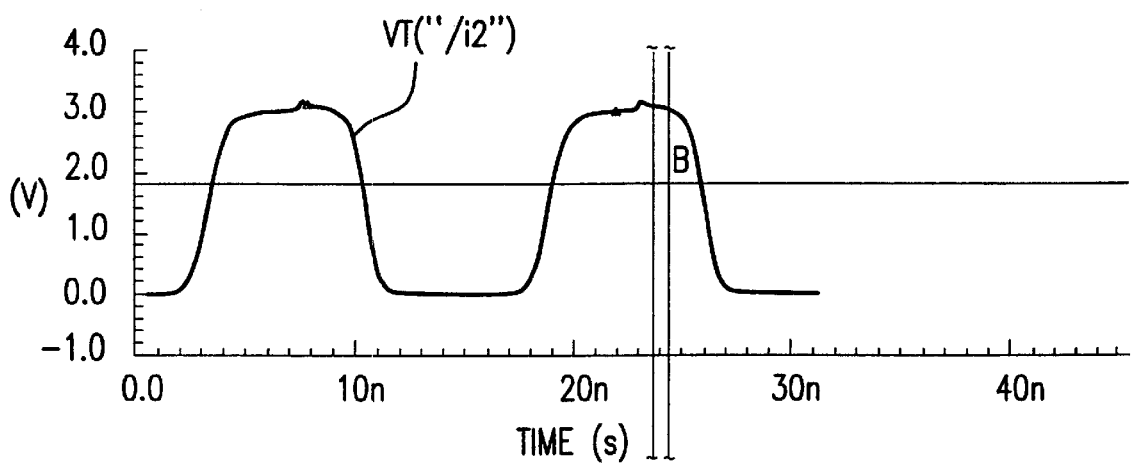
Figure 6:
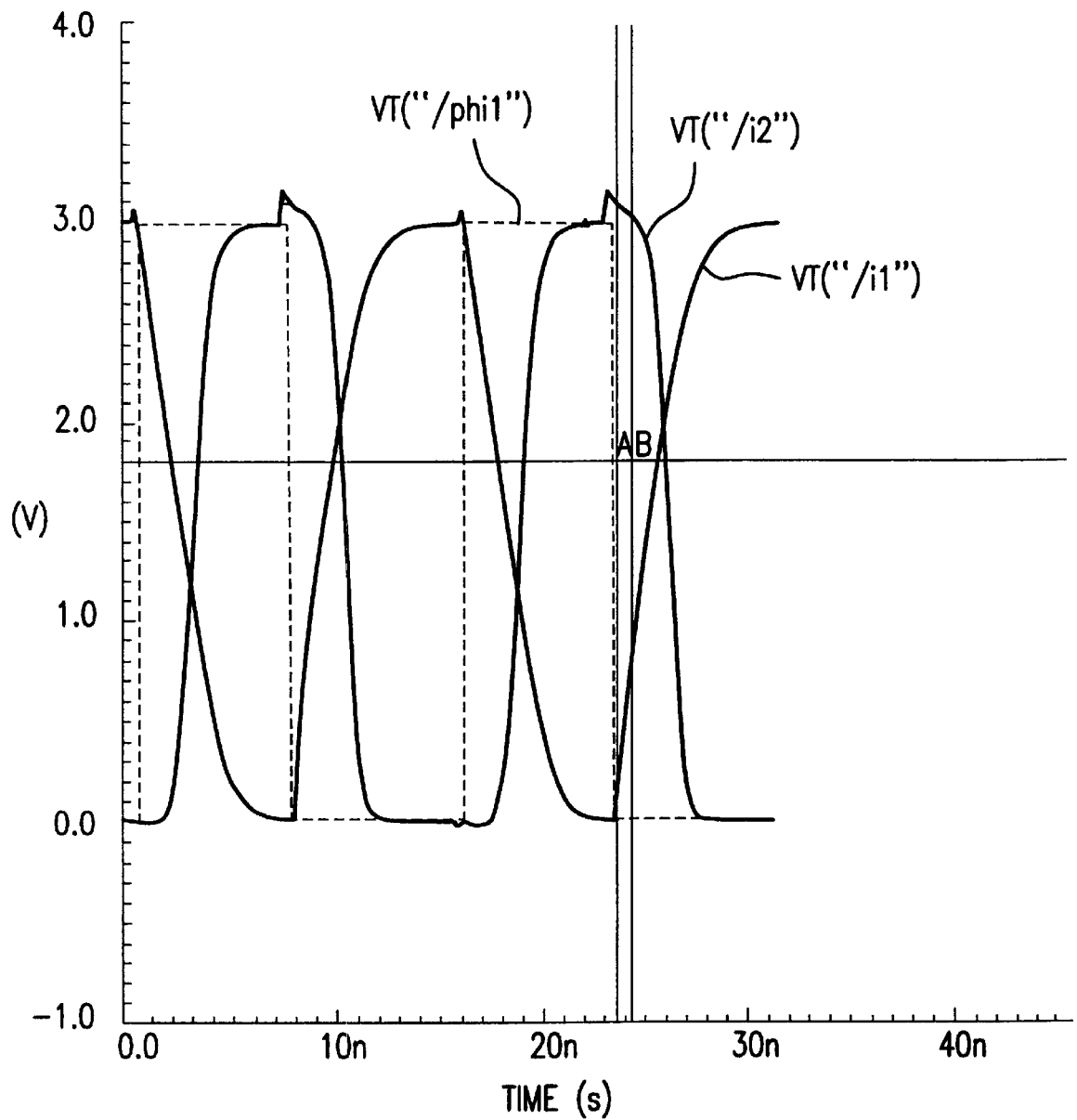

The circuit of FIG. 4 produces the waveforms illustrated in FIGS. 5A, 5B, 5C and 6, which plots voltage verses time. FIG. 5A shows the input voltage at node "phi1" of FIG. 4. FIG. 5B shows the voltage at node "i1" between the first and second I/C stages. FIG. 5C shows the voltage at the output of the second I/C stage the node "i2." FIG. 6 superimposes the input voltage, intermediate voltages i1 and output voltage i2. As best illustrated in FIG. 6, the addition of the second I/C stage produces an output waveform having steeper slopes, so as to provide a usable clock signal.

FIGS. 5A. 5B, 5C and 6 also show the delay between the input phi1 and the output i2. The amount of delay (i.e., the separation of vertical lines A and B) imparted by the circuit and method of the present invention can be changed by adjusting the value (i.e., amount) of the constant current provided by the current source and/or by adjusting the value (i.e., amount) of the capacitance of $C_{load}$. For example, the capacitance value can be changed by increasing or decreasing the thickness of the dielectric layer of the MOS capacitor forming $C_{load}$. As described above, the current source can be implemented by a variety of means. Thus, based on the disclosure herein, techniques for changing the amount of the constant current would become apparent to a any person skilled in the art.

While various embodiments of the present invention have been described above, it should be understood that they have been presented by way of example, and not limitation. It will be apparent to persons skilled in the relevant art that various changes in form and detail can be made therein without departing from the spirit and scope of the invention as defined in the claim(s). Among other reasons, this is true in light of (later) developing technology and terms within the relevant art(s). Thus the present invention should not be limited by any of the above-described exemplary embodiments, but should be defined only in accordance with the following claims and their equivalents.

What is claimed is:

1. A circuit for generating stable clock signals with respect to at least one of process, temperature and voltage variations, comprising:

a current source to generate a constant current having a first value;

a current over capacitance (I/C) portion coupled to said current source and between a supply voltage and ground, said I/C portion consisting of first and second I/C stages; and a capacitor having a second value and coupled to a node formed by an output of said first I/C stage and an input of said second I/C stage;

wherein application of a clock signal directly connected to an input of said first I/C stage generates an output at a logic gate coupled to an output of said second I/C stage, said output having a stable delay based on said first and second values;

wherein at least one of said first and second values changeable to adjust an amount of the delay.

2. The circuit of claim 1, wherein said first and second I/C stages each comprising a pair of complementary field effect transistors (FETs), gates of the FETs of a respective I/C stage being coupled together to form the input of that stage, and drains of the FETs of a respective I/C stage being coupled together to form the output of that stage.

3. The circuit of claim 1, wherein said current source comprises a bandgap circuit.

4. The circuit of claim 3, further comprising a switched capacitor circuit that provides a constant resistance, wherein the constant resistance and a constant voltage provided by said bandgap circuit generate the constant current.

5. The circuit of claim 3, further comprising a discrete resistor, wherein said discrete resistor and a constant voltage provided by said bandgap circuit generate the constant current.

6. The circuit of claim 1, wherein said current source further comprises cascoded current mirrors coupled between said supply voltage and said first and second I/C stages, and between said first and second I/C stages and ground.

7. The circuit of claim 1, wherein said constant current source further comprises cascoded current mirrors coupled between said supply voltage and said first and second I/C stages, and between said first and second I/C stages and ground.

8. A method for generating stable delays for stable clock signals with respect to at least one of process, temperature and voltage variations, comprising the steps of:

providing a constant current having a first value;

providing a current over capacitance (I/C) portion coupled to the constant current and between a supply voltage and ground, the I/C portion consisting of first and second I/C stages; and providing a capacitor having a second value and coupled to a node formed by an output of the first I/C stage and an input of the second I/C stage;

wherein application of a clock signal directly connected to an input of the first I/C stage generates an output at a logic gate coupled to an output of the second I/C stage, said output having a stable delay based on the first and second values.

9. The method of claim 8, further comprising the step of changing at least one of said first and second values to adjust an amount of the delay.

10. The method of claim 8, further comprising the step of providing said first and second I/C stages each with a pair of complementary field effect transistors (FETs), gates of the FETs of a respective I/C stage being coupled together to form the input of that stage, and drains of the FETs of a respective I/C stage being coupled together to form the output of that stage.

11. The method of claim 8, further comprising the step of providing the constant current with a bandgap circuit.

12. The method of claim 11, further comprising the steps of:

providing a constant voltage with the bandgap circuit;

providing a switched capacitor circuit to provide constant resistance; and producing the constant current with the constant voltage and the constant resistance.

13. The method of claim 11, further comprising the steps of:

providing a discrete resistor; and providing a constant voltage with the bandgap circuit; and producing the constant current with the constant voltage and the discrete resistor.

14. The method of claim 8, further comprising the step of providing the constant current with cascoded current mirrors coupled between said supply voltage and said first and second I/C stages, and between said first and second I/C stages and ground.

15. The method of claim 8, further comprising the steps of providing said constant current with cascoded current mirrors coupled between said supply voltage and said first and second I/C stages, and between said first and second I/C stages and ground.

* * * * *